US011881384B2

(12) United States Patent
Carducci et al.

(10) Patent No.: US 11,881,384 B2
(45) Date of Patent: *Jan. 23, 2024

(54) MONOLITHIC MODULAR MICROWAVE SOURCE WITH INTEGRATED PROCESS GAS DISTRIBUTION

(71) Applicant: Applied Materials, Inc., Santa Clara, CA (US)

(72) Inventors: James Carducci, Sunnyvale, CA (US); Richard C. Fovell, San Jose, CA (US); Larry D. Elizaga, Tracy, CA (US); Silverst Rodrigues, Bangalore (IN); Vladimir Knyazik, Santa Clara, CA (US); Philip Allan Kraus, San Jose, CA (US); Thai Cheng Chua, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 288 days.

This patent is subject to a terminal disclaimer.

(21) Appl. No.: 16/586,482

(22) Filed: Sep. 27, 2019

(65) Prior Publication Data

US 2021/0098231 A1  Apr. 1, 2021

(51) Int. Cl.
*H01J 37/32* (2006.01)
*C23C 16/511* (2006.01)
*C23C 16/455* (2006.01)

(52) U.S. Cl.
CPC .... *H01J 37/3244* (2013.01); *C23C 16/45559* (2013.01); *C23C 16/45561* (2013.01);
(Continued)

(58) Field of Classification Search
CPC ............. H01J 37/3244; H01J 2237/335; H01J 2237/334; H01J 2237/3321;
(Continued)

(56) References Cited

U.S. PATENT DOCUMENTS 7,175,713 B2 * 2/2007 Thakur ............. H01J 37/32009
                                                    118/723 R
7,252,716 B2 * 8/2007 Kim ..................... C23C 16/4558
                                                    118/715
(Continued)

FOREIGN PATENT DOCUMENTS

CN      109564843 A      4/2019
JP      2013191593 A     9/2013
(Continued)

OTHER PUBLICATIONS

International Search Report and Written Opinion of the International Searching Authority for PCT/US2020/051262, dated Dec. 29, 2020, pp. 11.

(Continued)

*Primary Examiner* — Rudy Zervigon
(74) *Attorney, Agent, or Firm* — Schwabe, Williamson & Wyatt, P.C.

(57) ABSTRACT

Embodiments disclosed herein include a housing for a source array. In an embodiment, the housing comprises a conductive body, where the conductive body comprises a first surface and a second surface opposite from the first surface. In an embodiment a plurality of openings are formed through the conductive body and a channel is disposed into the second surface of the conductive body. In an embodiment, a cover is over the channel, and the cover comprises first holes that pass through a thickness of the cover. In an embodiment, the housing further comprises a second hole through a thickness of the conductive body. In an embodiment, the second hole intersects with the channel.

19 Claims, 9 Drawing Sheets

(52) U.S. Cl.
    CPC ....... *C23C 16/511* (2013.01); *H01J 2237/334* (2013.01); *H01J 2237/335* (2013.01); *H01J 2237/3321* (2013.01)

(58) Field of Classification Search
    CPC .............. H01J 37/3211; H01J 37/3222; C23C 16/45559; C23C 16/511; C23C 16/45561
    USPC .............. 118/723 I, 723 IR, 723 AN, 723 E; 156/345.43, 345.44, 345.48, 345.49, 156/345.47
    See application file for complete search history.

(56) References Cited

U.S. PATENT DOCUMENTS

| | | | | |
|---|---|---|---|---|
| 8,075,690 | B2* | 12/2011 | Keller | H01J 37/3244 |
| | | | | 156/345.33 |
| 9,055,661 | B2* | 6/2015 | Tanaka | H01J 37/32568 |
| 10,418,225 | B2 | 9/2019 | Collins et al. | |
| 11,049,694 | B2* | 6/2021 | AuBuchon | H01J 37/32256 |
| 2001/0054381 | A1* | 12/2001 | Umotoy | C23C 16/4412 |
| | | | | 118/715 |
| 2006/0228496 | A1* | 10/2006 | Choi | H01J 37/3244 |
| | | | | 427/569 |
| 2010/0065214 | A1 | 3/2010 | Kennedy et al. | |
| 2010/0230387 | A1* | 9/2010 | Okesaku | C23C 16/45568 |
| | | | | 427/575 |
| 2011/0180233 | A1* | 7/2011 | Bera | F28F 7/02 |
| | | | | 165/47 |
| 2013/0264014 | A1 | 10/2013 | Iizuka | |
| 2015/0024582 | A1 | 1/2015 | Taylor | |
| 2021/0098230 | A1* | 4/2021 | Chua | H01J 37/3211 |
| 2021/0233748 | A1* | 7/2021 | Watanabe | H01J 37/32568 |

FOREIGN PATENT DOCUMENTS

| | | |
|---|---|---|
| JP | 2014160819 A | 9/2014 |
| JP | 2017534174 A | 11/2017 |
| KR | 101246191 B1 | 3/2013 |
| TW | 200415726 A | 8/2004 |
| WO | 2004032176 A1 | 4/2004 |
| WO | 2018218160 A1 | 11/2018 |

OTHER PUBLICATIONS

Official Letter from Taiwan Patent Application No. 109133276 dated Dec. 7, 2022, 11 pgs.
International Preliminary Report on Patentability for PCT/US2020/051262, dated Apr. 7, 2022, pp. 6.
Notice of Reasons for Rejection from Japanese Patent Application No. 2022-518724 dated Mar. 17, 2023, 10 pgs.

* cited by examiner

MONOLITHIC MODULAR MICROWAVE SOURCE WITH INTEGRATED PROCESS GAS DISTRIBUTION

BACKGROUND

1) Field

Embodiments relate to the field of semiconductor manufacturing and, in particular, to monolithic source arrays with integrated process gas distribution for high-frequency sources.

2) Description of Related Art

Some high-frequency plasma sources include applicators that pass through an opening in a dielectric plate. The opening through the dielectric plate allows for the applicator (e.g., a dielectric cavity resonator) to be exposed to the plasma environment. However, it has been shown that plasma is also generated in the opening in the dielectric plate in the space surrounding the applicator. This has the potential of generating plasma non-uniformities within the processing chamber. Furthermore, exposing the applicator to the plasma environment may lead to a more rapid degradation of the applicator.

In some embodiments, the applicators are positioned over the dielectric plate or within a cavity into (but not through) the dielectric plate. Such configurations have reduced coupling with the interior of the chamber and, therefore, does not provide an optimum plasma generation. The coupling of the high-frequency electromagnetic radiation with the interior of the chamber is diminished in part due to the additional interface between the dielectric plate and the applicator across which the high-frequency electromagnetic radiation needs to propagate. Additionally, variations of the interface (e.g., positioning of the applicator, surface roughness of the applicator and/or the dielectric plate, angle of the applicator relative to the dielectric plate, etc.) at each applicator and across different processing tools may result in plasma non-uniformities.

Particularly, when the applicators are discrete components from the dielectric plate, plasma non-uniformity (within a single processing chamber and/or across different processing chambers (e.g., chamber matching)) is more likely to occur. For example, with discrete components, small variations (e.g., variations in assembly, machining tolerances, etc.) can result in plasma non-uniformities that negatively affect processing conditions within the chamber.

SUMMARY

Embodiments disclosed herein include a housing for a source array. In an embodiment, the housing comprises a conductive body, where the conductive body comprises a first surface and a second surface opposite from the first surface. In an embodiment a plurality of openings are formed through the conductive body and a channel is disposed into the second surface of the conductive body. In an embodiment, a cover is over the channel, and the cover comprises first holes that pass through a thickness of the cover. In an embodiment, the housing further comprises a second hole through a thickness of the conductive body. In an embodiment, the second hole intersects with the channel.

Embodiments may also include an assembly for a processing tool that comprises a monolithic source array and a housing. In an embodiment, the monolithic source array comprises a dielectric plate with a first surface and a second surface opposite from the first surface, and a plurality of protrusions extending out from the first surface of the dielectric plate. In an embodiment, a plurality of gas distribution holes pass from the first surface to the second surface of the dielectric plate. In an embodiment, the housing is attached to the monolithic source array and comprises a conductive body with a third surface and a fourth surface opposite from the third surface. In an embodiment, a plurality of openings through the conductive body, and each of the openings surround a different one of the plurality of protrusions. In an embodiment, a channel is disposed into the fourth surface of the conductive body, and a cover is over the channel. In an embodiment, the cover comprises a plurality of first holes that are fluidically coupled to a gas distribution hole. In an embodiment, the housing further comprises a second hole through the conductive body that intersects with the channel.

Embodiments may also comprise a processing tool. In an embodiment, the processing tool comprises a chamber and an assembly that interfaces with the chamber. In an embodiment, the assembly comprises a monolithic source array with a plurality of protrusions and a plurality of gas distribution holes through a thickness of the monolithic source array. In an embodiment, the monolithic source array further comprises a housing with a conductive body and openings through the conductive body for receiving the plurality of protrusions. In an embodiment, a channel in the conductive body is fluidically coupled to the gas distribution holes.

DETAILED DESCRIPTION

Figure 1:
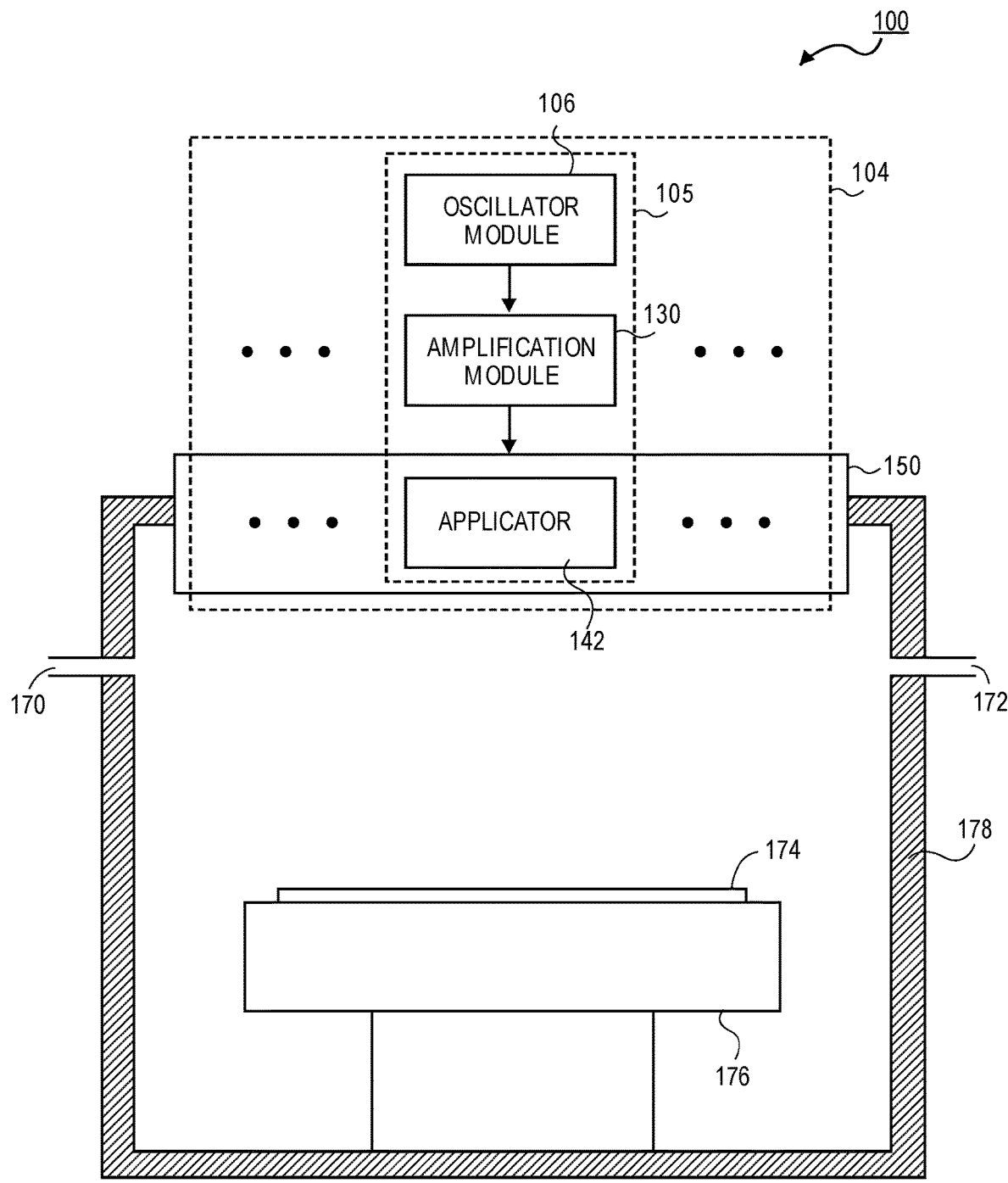
FIG. 1 is a schematic illustration of a processing tool that comprises a modular high-frequency emission source with a monolithic source array that comprises a plurality of applicators, in accordance with an embodiment.

Systems described herein include monolithic source arrays with integrated gas distribution for high-frequency sources. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, high-frequency plasma sources with discrete applicators may result in plasma non-uniformities within a chamber and in non-optimum injection of the high-frequency electromagnetic radiation into the chamber. The non-uniformities in the plasma may arise for different reasons, such as assembly issues, manufacturing tolerances, degradation, and the like. The non-optimum injection of the high-frequency electromagnetic radiation into the chamber may result (in part) from the interface between the applicator and the dielectric plate.

Accordingly, embodiments disclosed herein include a monolithic source array. In an embodiment, the monolithic source array comprises a dielectric plate and a plurality of protrusions that extend up from a surface of the dielectric plate. Particularly, the protrusions and the dielectric plate form a monolithic part. That is, the protrusions and the dielectric plate are fabricated from a single block of material. The protrusions have dimensions suitable for being used as the applicators. For example, holes into the protrusions may be fabricated that accommodate a monopole antenna. The protrusions may, therefore, function as a dielectric cavity resonator.

Implementing the source array as a monolithic part has several advantages. One benefit is that tight machining tolerances may be maintained in order to provide a high degree of uniformity between parts. Whereas discrete applicators need assembly, the monolithic source array avoids possible assembly variations. Additionally, the use of a monolithic source array provides improved injection of high-frequency electromagnetic radiation into the chamber, because there is no longer a physical interface between the applicator and the dielectric plate.

Monolithic source arrays also provide improved plasma uniformity in the chamber. Particularly, the surface of the dielectric plate that is exposed to the plasma does not include any gaps to accommodate the applicators. Furthermore, the lack of a physical interface between the protrusions and the dielectric plate improves lateral electric field spreading in the dielectric plate.

Monolithic source arrays also require a different gas distribution scheme than previous solutions. Previously, the gas was flown into the chamber through openings in the dielectric plate that accommodated the applicators. Since these openings are removed, a different solution is required. Accordingly, embodiments disclosed herein include a gas distribution scheme that is implemented by different components of the assembly. For example, the horizontal distribution of the gas may be implemented in the housing surrounding the monolithic source array. Accordingly, only vertical gas distribution holes need to be drilled into monolithic source array. That is, the monolithic source array does not necessitate horizontal gas routing passages in some embodiments. This simplifies the manufacture of the monolithic source array and reduces costs.

Referring now to FIG. 1, a cross-sectional illustration of a plasma processing tool 100 is shown, according to an embodiment. In some embodiments, the processing tool 100 may be a processing tool suitable for any type of processing operation that utilizes a plasma. For example, the processing tool 100 may be a processing tool used for plasma enhanced chemical vapor deposition (PECVD), plasma enhanced atomic layer deposition (PEALD), etch and selective removal processes, and plasma cleaning. Additional embodiments may include a processing tool 100 that utilizes high-frequency electromagnetic radiation without the generation of a plasma (e.g., microwave heating, etc.). As used herein, "high-frequency" electromagnetic radiation includes radio frequency radiation, very-high-frequency radiation, ultra-high-frequency radiation, and microwave radiation. "High-frequency" may refer to frequencies between 0.1 MHz and 300 GHz.

Generally, embodiments include a processing tool 100 that includes a chamber 178. In processing tools 100, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. While not shown, it is to be appreciated that gas may also be injected into the chamber 178 through a monolithic source array 150 (e.g., as a showerhead) for evenly distributing the processing gases over a substrate 174.

In an embodiment, the substrate 174 may be supported on a chuck 176. For example, the chuck 176 may be any suitable chuck, such as an electrostatic chuck. The chuck 176 may also include cooling lines and/or a heater to provide temperature control to the substrate 174 during processing. Due to the modular configuration of the high-frequency emission modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes a modular high-frequency emission source 104. The modular high-frequency emission source 104 may comprise an array of high-frequency emission modules 105. In an embodiment, each high-frequency emission module 105 may include an oscillator module 106, an amplification module 130, and an applicator 142. As shown, the applicators 142 are schematically shown as being integrated into the monolithic source array 150. However, it is to be appreciated that the monolithic source array 150 may be a monolithic structure that comprises one or more portions of the applicator 142 (e.g., a dielectric resonating body) and a dielectric plate that faces the interior of the chamber 178.

In an embodiment, the oscillator module 106 and the amplification module 130 may comprise electrical components that are solid state electrical components. In an embodiment, each of the plurality of oscillator modules 106 may be communicatively coupled to different amplification modules 130. In some embodiments, there may be a 1:1 ratio between oscillator modules 106 and amplification modules 130. For example, each oscillator module 106 may be electrically coupled to a single amplification module 130. In an embodiment, the plurality of oscillator modules 106 may generate incoherent electromagnetic radiation. Accordingly, the electromagnetic radiation induced in the chamber 178 will not interact in a manner that results in an undesirable interference pattern.

In an embodiment, each oscillator module 106 generates high-frequency electromagnetic radiation that is transmitted to the amplification module 130. After processing by the amplification module 130, the electromagnetic radiation is transmitted to the applicator 142. In an embodiment, the applicators 142 each emit electromagnetic radiation into the chamber 178. In some embodiments, the applicators 142 couple the electromagnetic radiation to the processing gasses in the chamber 178 to produce a plasma.

Figure 2:
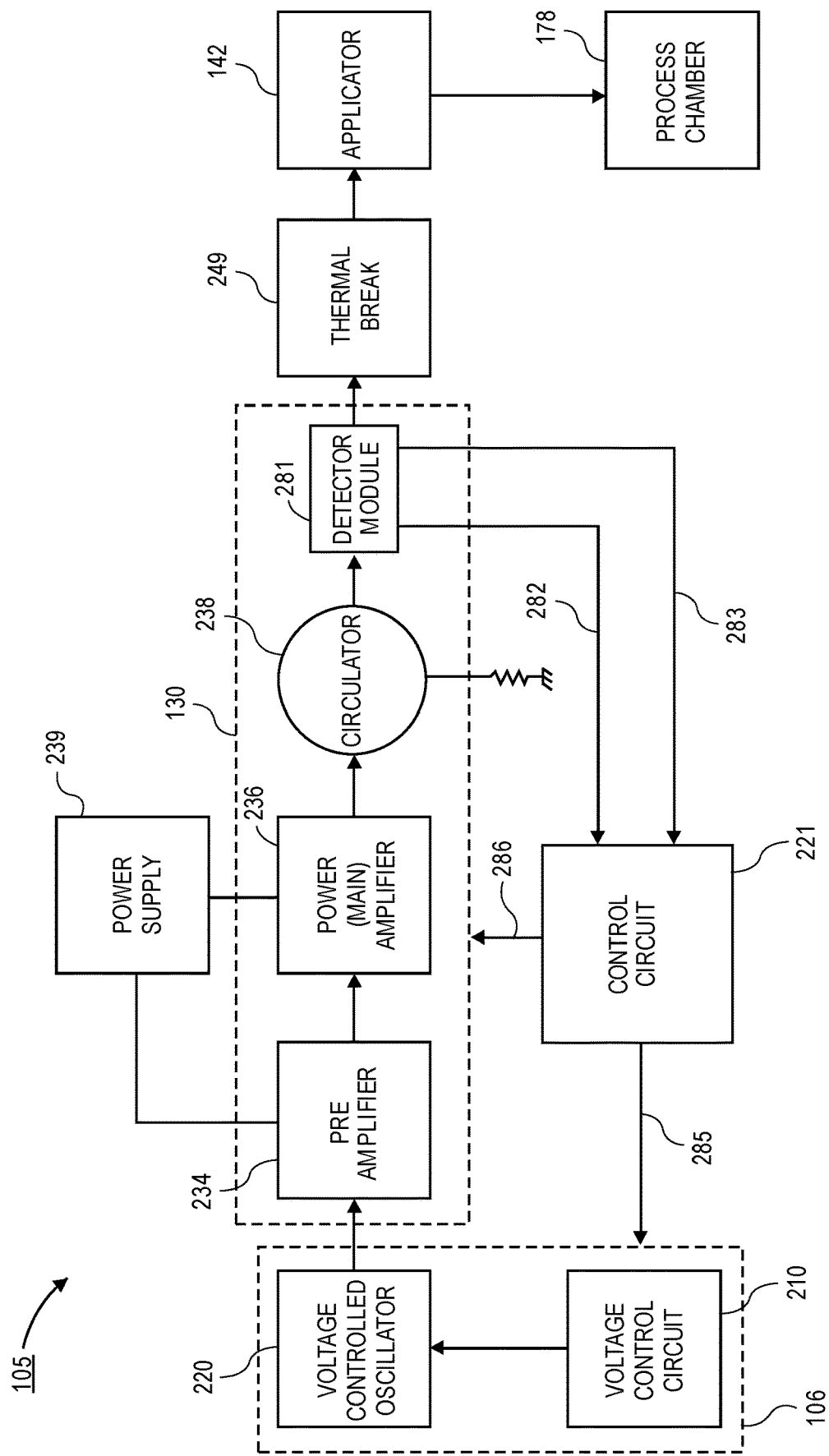
FIG. 2 is a block diagram of a modular high-frequency emission module, in accordance with an embodiment.

Referring now to FIG. 2, a schematic of a solid state high-frequency emission module 105 is shown, in accordance with an embodiment. In an embodiment, the high-frequency emission module 105 comprises an oscillator module 106. The oscillator module 106 may include a voltage control circuit 210 for providing an input voltage to a voltage controlled oscillator 220 in order to produce high-frequency electromagnetic radiation at a desired frequency. Embodiments may include an input voltage between approximately 1V and 10V DC. The voltage controlled oscillator 220 is an electronic oscillator whose oscillation frequency is controlled by the input voltage. According to an embodiment, the input voltage from the voltage control circuit 210 results in the voltage controlled oscillator 220 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz.

According to an embodiment, the electromagnetic radiation is transmitted from the voltage controlled oscillator 220 to an amplification module 130. The amplification module 130 may include a driver/pre-amplifier 234, and a main power amplifier 236 that are each coupled to a power supply 239. According to an embodiment, the amplification module 130 may operate in a pulse mode. For example, the amplification module 130 may have a duty cycle between 1% and 99%. In a more particular embodiment, the amplification module 130 may have a duty cycle between approximately 15% and 50%.

In an embodiment, the electromagnetic radiation may be transmitted to the thermal break 249 and the applicator 142 after being processed by the amplification module 130. However, part of the power transmitted to the thermal break 249 may be reflected back due to the mismatch in the output impedance. Accordingly, some embodiments include a detector module 281 that allows for the level of forward power 283 and reflected power 282 to be sensed and fed back to the control circuit module 221. It is to be appreciated that the detector module 281 may be located at one or more different locations in the system (e.g., between the circulator 238 and the thermal break 249). In an embodiment, the control circuit module 221 interprets the forward power 283 and the reflected power 282, and determines the level for the control signal 285 that is communicatively coupled to the oscillator module 106 and the level for the control signal 286 that is communicatively coupled to the amplification module 130. In an embodiment, control signal 285 adjusts the oscillator module 106 to optimize the high-frequency radiation coupled to the amplification module 130. In an embodiment, control signal 286 adjusts the amplification module 130 to optimize the output power coupled to the applicator 142 through the thermal break 249. In an embodiment, the feedback control of the oscillator module 106 and the amplification module 130, in addition to the tailoring of the impedance matching in the thermal break 249 may allow for the level of the reflected power to be less than approximately 5% of the forward power. In some embodiments, the feedback control of the oscillator module 106 and the amplification module 130 may allow for the level of the reflected power to be less than approximately 2% of the forward power.

Accordingly, embodiments allow for an increased percentage of the forward power to be coupled into the processing chamber 178, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 220.

Figure 3:
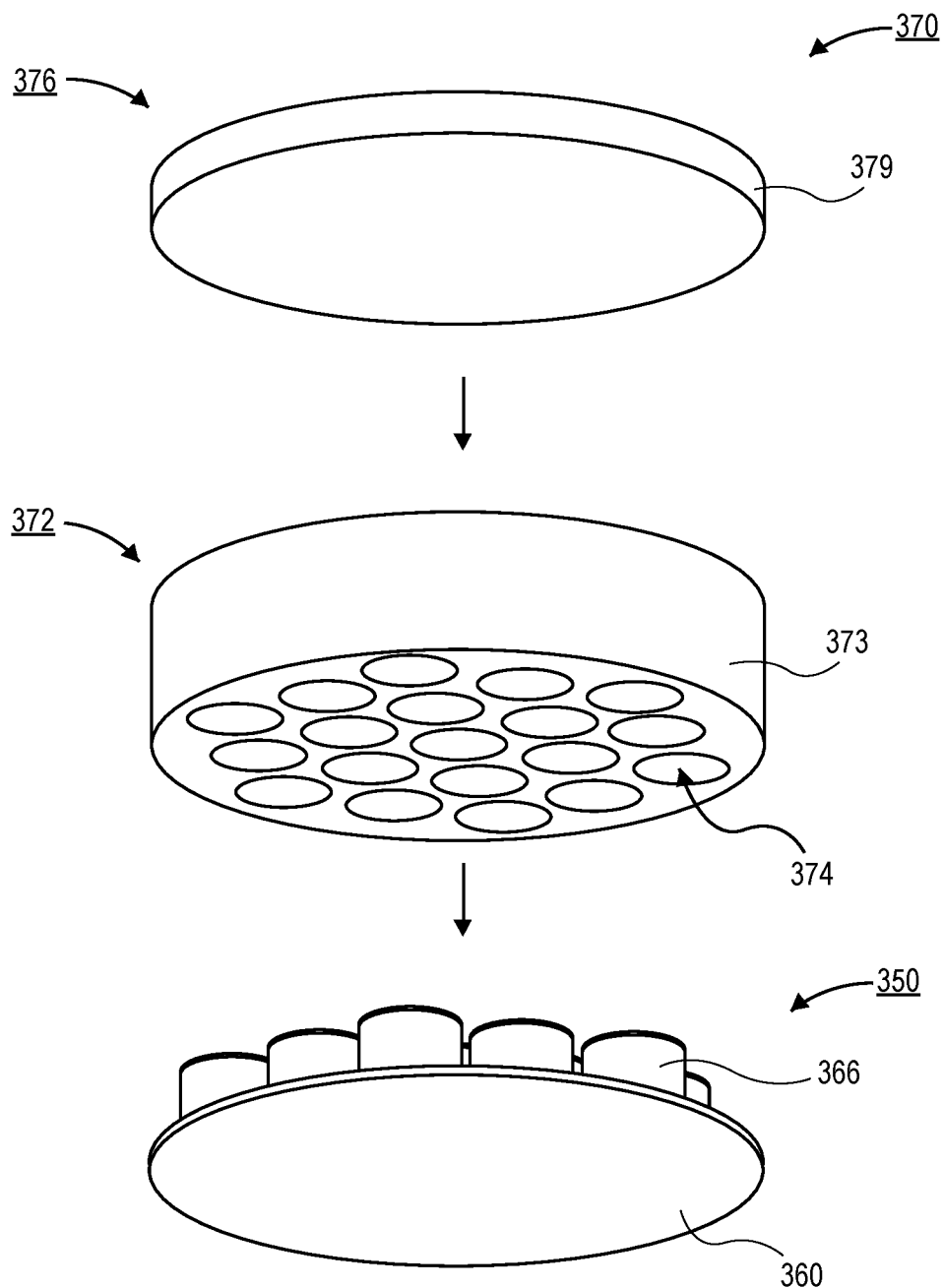
FIG. 3 is an exploded perspective view of an assembly, in accordance with an embodiment.

Referring now to FIG. 3, an exploded perspective view illustration of an assembly 370 is shown, in accordance with an embodiment. In an embodiment, the assembly 370 comprises a monolithic source array 350, a housing 372, and a lid plate 376. As indicated by the arrows, the housing 372 fits over and around the monolithic source array 350, and the lid plate 376 covers the housing 372. In the illustrated embodiment, the assembly 370 is shown as having a substantially circular shape. However, it is to be appreciated that the assembly 370 may have any desired shape (e.g., polygonal, elliptical, wedge shaped, or the like).

In an embodiment, the monolithic source array 350 may comprise a dielectric plate 360 and a plurality of protrusions 366 that extend up from the dielectric plate 360. In an embodiment, the dielectric plate 360 and the plurality of protrusions 366 are a monolithic structure. That is, there is no physical interface between a bottom of the protrusions 366 and the dielectric plate 360. As used herein, a "physical interface" refers to a first surface of a first discrete body contacting a second surface of a second discrete body.

Each of the protrusions 366 are a portion of the applicator 142 used to inject high-frequency electromagnetic radiation into a processing chamber 178. Particularly, the protrusions 366 function as the dielectric cavity resonator of the applicator 142. In an embodiment, the monolithic source array 350 comprises a dielectric material. For example, the monolithic source array 350 may be a ceramic material. In an embodiment, one suitable ceramic material that may be used for the monolithic source array 350 is $Al_2O_3$. The monolithic structure may be fabricated from a single block of material. In other embodiments, a rough shape of the monolithic source array 350 may be formed with a molding process, and subsequently machined to provide the final structure with the desired dimensions. For example, green state machining and firing may be used to provide the desired shape of the monolithic source array 350. In the illustrated embodiment, the protrusions 366 are shown as having a circular cross-section (when viewed along a plane parallel to the dielectric plate 360). However, it is to be appreciated that the protrusions 366 may comprise many different cross-sections. For example, the cross-section of the protrusions 366 may have any shape that is centrally symmetric.

In an embodiment, the housing 372 comprises a first conductive body 373. For example, the first conductive body 373 may be aluminum or the like. The housing comprises a plurality of openings 374. The openings 374 may pass entirely through a thickness of the first conductive body 373. The openings 374 may be sized to receive the protrusions 366. For example, as the housing 372 is displaced towards the monolithic source array 350 (as indicated by the arrow) the protrusions 366 will be inserted into the openings 374. In an embodiment, the openings 374 may have a diameter that is approximately 15mm or greater.

In the illustrated embodiment, the housing 372 is shown as a single first conductive body 373. However, it is to be appreciated that the housing 372 may comprise one or more discrete conductive components. The discrete components may be individually grounded, or the discrete components may be joined mechanically or by any form of metallic bonding, to form a single first electrically conductive body 373.

In an embodiment, the lid plate 376 may comprise a second conductive body 379. In an embodiment, the second conductive body 379 is formed from the same material as the first conductive body 373 of the housing 372. For example, the lid plate 376 may comprise aluminum. In an embodiment, the lid plate 376 may be secured to the housing 372 using any suitable fastening mechanism. For example, the lid plate 376 may be secured to the housing 372 with bolts or the like. In some embodiments, the lid plate 376 and the housing 372 may also be implemented as a single monolithic structure. In an embodiment, the lid plate 376 and the housing 372 are both electrically grounded during operation of the processing tool.

Figure 4A:
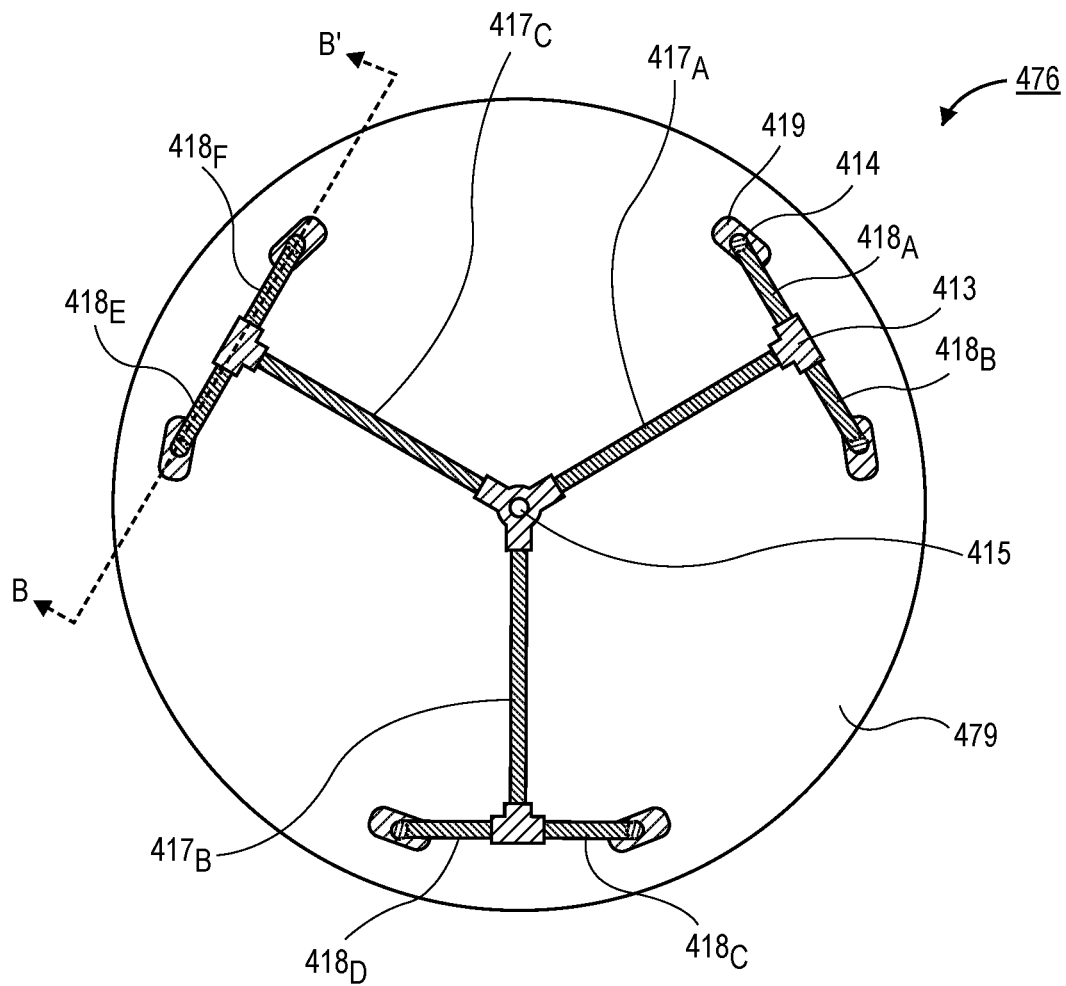
FIG. 4A is a plan view illustration of a lid plate and gas distribution lines, in accordance with an embodiment.
Figure 4B:
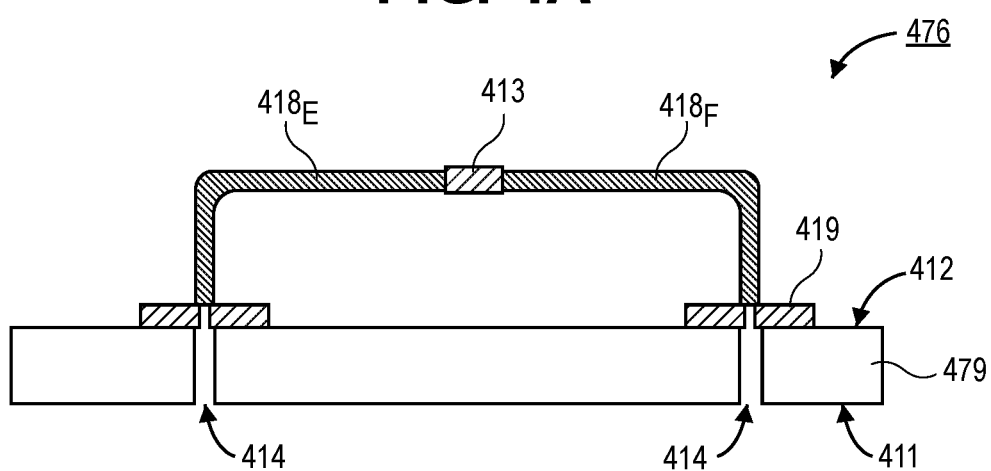
FIG. 4B is a cross-sectional illustration of the lid plate in FIG. 4A along line B-B', in accordance with an embodiment.

Referring now to FIGS. 4A and 4B, more detailed plan view and cross-sectional view illustrations of the lid plate 476 are shown, respectively, in accordance with an embodiment. As shown, gas lines are coupled to a first surface 412 of the lid plate 476. For example, a single input 415 may split to a plurality of first gas lines $417_{A-C}$. Each of the first gas lines 417 may be further distributed at a splitter 413 to second gas lines $418_{A-F}$. The second gas lines 418 are coupled to the lid plate 476 (e.g., with couplers 419 that are bolted to the lid plate 476). In an embodiment, the couplers 419 may secure an O-ring (not shown) that seals the junction between the end of the second gas line 418 and the hole 414 through the lid plate 476. As shown in FIG. 4B, the hole 414 passes through the conductive body 479 from the first surface 412 to a second surface 411 of the lid plate 476.

In an embodiment, each of the first gas lines 417 are substantially the same length, and each of the second gas lines 418 are substantially the same length. As such, a length of each path (from the input 415 to one of the holes 414 in the lid plate 476) is substantially uniform. While one example of a gas line routing scheme is provided, it is to be appreciated that any number of holes 414 and any number of gas lines 417/418 may be used to route a processing gas to the lid plate 476.

Figure 5A:
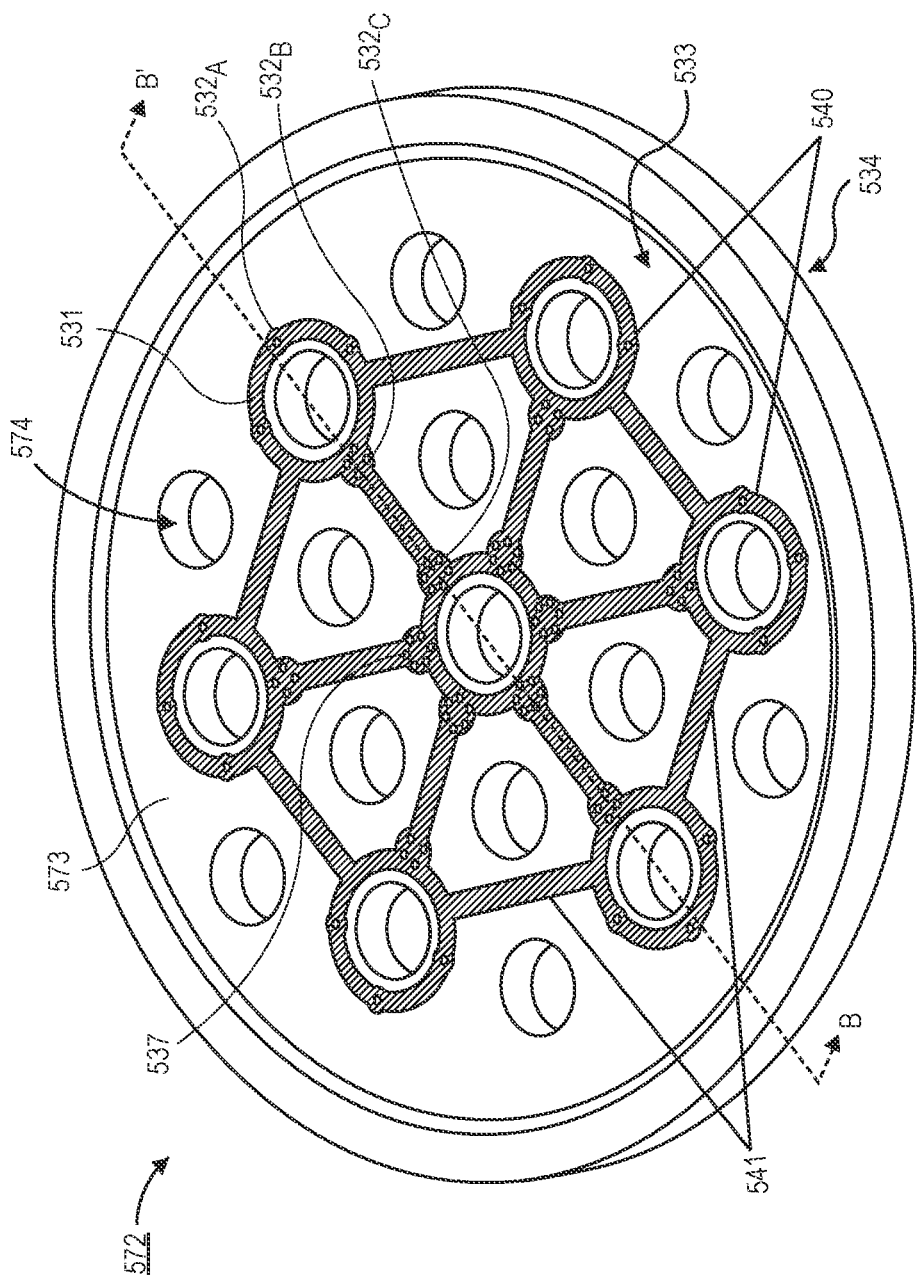
FIG. 5A is a perspective view illustration of a bottom surface of a conductive housing, in accordance with an embodiment.

Referring now to FIG. 5A, a perspective view illustration of the housing 572 is shown, in accordance with an embodiment. The illustrated embodiment depicts a second surface 533 of the housing 572. The second surface 533 is the surface that faces towards the monolithic source array, and a first surface 534 faces towards the lid plate. As shown, the housing 572 comprises a conductive body 573 with a plurality of openings 574.

In an embodiment, a plurality of gas distribution channels are disposed into a second surface 533. The gas distribution channels are covered by a cover 531 including circular (540) and linear (541) portions. In an embodiment, the cover 531 is welded to the conductive body 573 to provide an air-tight seal. The gas distribution channels and the covers 531 distribute gas from an outer perimeter of the housing 572 towards an axial center of the housing 572. In the illustrated embodiment each of the gas distribution channels and the cover 531 encircle one or more of the openings 574. However, it is to be appreciated that other embodiments may include gas distribution channels that take any path. In the illustrated embodiment, a single continuous gas distribution channel and a cover 531 are shown. However, it is to be appreciated that embodiments may include any number of gas distribution channels (e.g., one or more gas distribution channels that may or may not be fluidically coupled together), and each gas distribution channel may have a different cover. Furthermore, it is to be appreciated that the openings 574 and the gas distribution channels are not fluidically coupled to each other. That is, during operation processing gasses that are flown through the gas distribution channels, and processing gasses may not pass through the openings 574.

In an embodiment, groups 532 of first holes 537 may pass through the cover 531. The groups 532 of first holes 537 provide exit locations for gas within the gas distribution channels. In an embodiment, the number of first holes 537 in each group 532 may be non-uniform. For example, groups 532A may have one or two holes 537, groups $532_B$ may have three or four holes 537, and groups $532_C$ may have more than four holes 537. That is, locations closer to the axial center of the housing 572 may have groups with a larger number of holes 537 than locations closer to the perimeter of the housing 572. In an embodiment, each group 532 may be surrounded by an O-ring or other sealing member. The O-ring compresses against the monolithic source array to provide a seal.

Figure 5B:
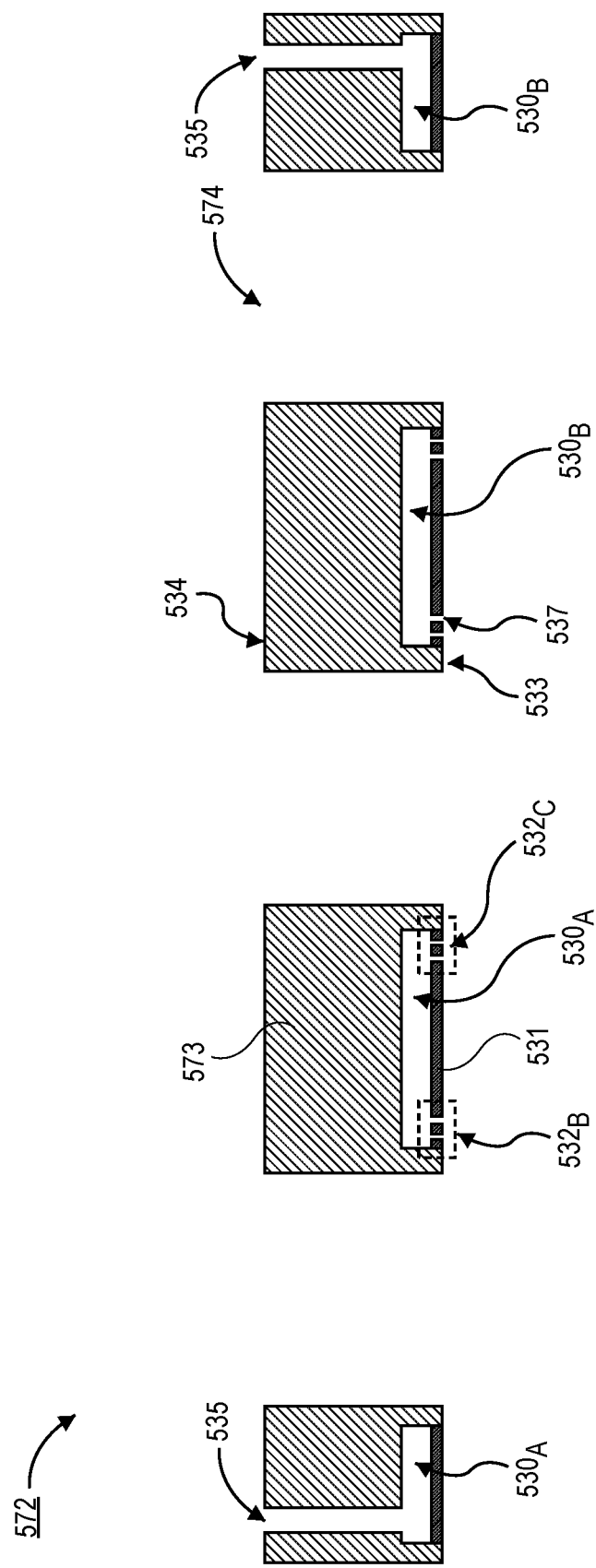
FIG. 5B is a cross-sectional illustration of the conductive housing in FIG. 5A along line B-B', in accordance with an embodiment.

Referring now to FIG. 5B, a cross-sectional illustration of the housing 572 in FIG. 5A along line B-B' is shown, in accordance with an embodiment. The cross-sectional illustration more clearly illustrates the gas distribution channels 530. The channels 530 are recessed into the second surface 533 of the conductive body 573. In the cross-sectional illustration, the channels 530 are shown as discontinuous, but it is to be appreciated that portions of the channels 530 may wrap around the openings 574 out of the plane of FIG. 5B in order to fluidically couple portions of the channels 530 together. For example, the illustrated portions of channel $530_A$ are fluidically coupled together, and the illustrated portions of the channel $530_B$ are fluidically coupled together.

In an embodiment, the channels 530 are fed processing gasses from the second holes 535 that pass vertically through the conductive body 573. That is, the second holes 535 intersect with the channels 530. The second holes 535 may be fluidically coupled to the holes 414 through the lid plate 476. In an embodiment, the second holes 535 are located proximate to the edge of the housing 572, and the channels 530 distribute the processing gasses horizontally. The covers 531 are over the channels 530 and provide a seal, except for locations of the groups 532 of first holes 537. The groups $532_B$ and $532_C$ are visible in the illustrated cross-section and the group $532_A$ is out of the plane shown in FIG. 5B. The distribution of the groups 532 of first holes 537 along the channel 530 provides uniform gas distribution across the surface of a workpiece in the processing tool.

Figure 6:
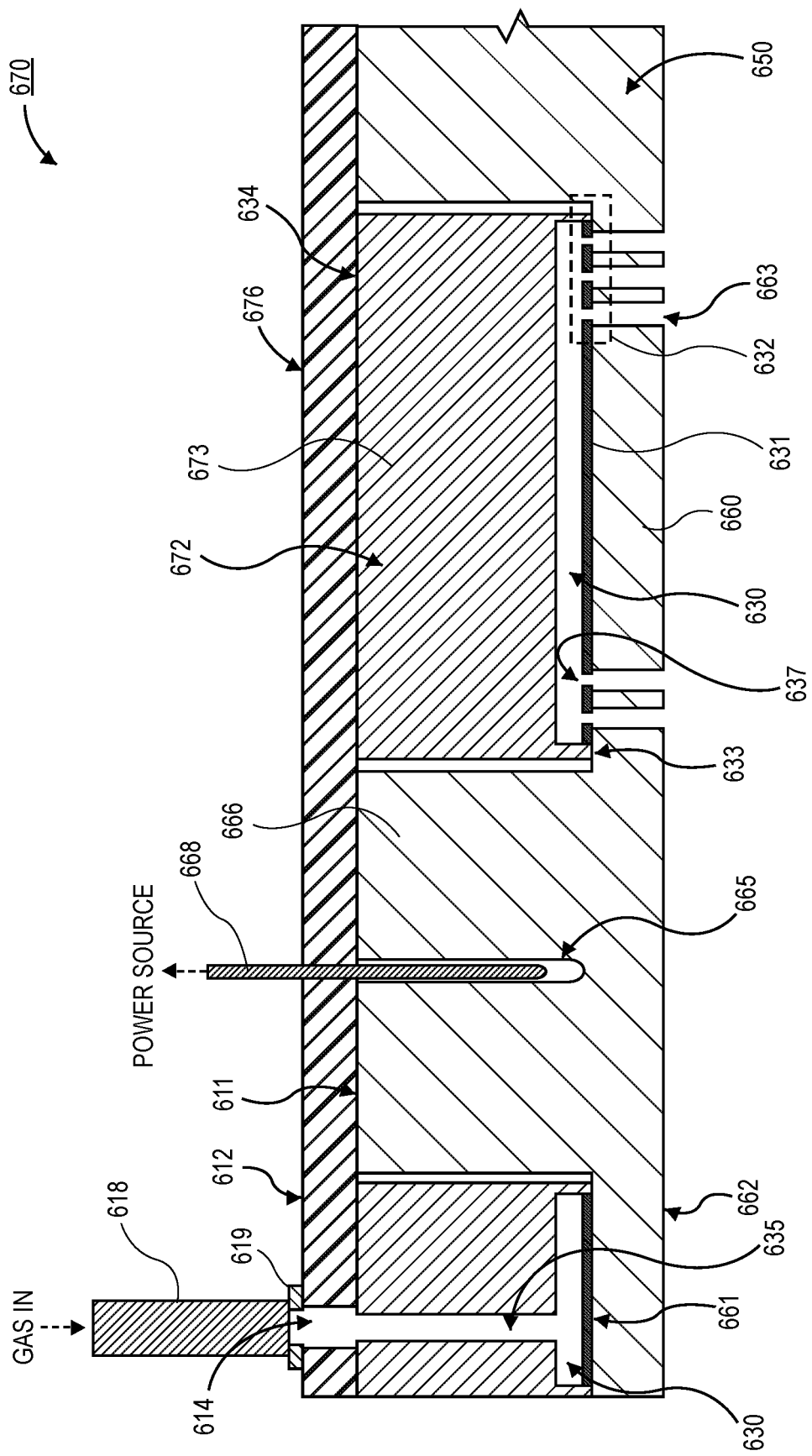
FIG. 6 is a cross-sectional illustration of a portion of the assembly that more clearly illustrates the gas distribution network, in accordance with an embodiment.

Referring now to FIG. 6, a cross-sectional illustration of a portion of the assembly 670 is shown, in accordance with an embodiment. The assembly 670 comprises a monolithic source array 650, a housing 672, and a lid plate 676.

In an embodiment, the second surface 633 of the conductive body 673 is supported by the first surface 661 of the dielectric plate 660. In the illustrated embodiment, the conductive body 673 is directly supported by the first surface 661, but it is to be appreciated that a thermal interface material or the like may separate the conductive body 673 from the first surface 661. In an embodiment, the second surface 662 of the dielectric plate 660 faces away from the housing 672. The protrusions 666 of the monolithic source array 650 fit into openings in the housing 672. In an embodiment, the lid plate 676 covers the housing 672 and the protrusions 666. For example, a second surface 611 of the lid plate 676 covers the first surface 634 of the housing 672. A monopole antenna 668 may pass through the lid plate 676 and extend into a hole 665 in the axial center of the protrusion 666. The width of the hole 665 may be greater than the width of the monopole antenna 668. Accordingly, tolerances for thermal expansion are provided in some embodiments in order to prevent damage to the monolithic source array 650. The monopole antenna 668 is electrically coupled to a power source (e.g., a high-frequency emission module 105).

In an embodiment, the gas distribution network passes through the components of the assembly 670. The gas is initially fed into the assembly 670 by a gas line 618. The gas line 618 is coupled to the first surface 612 of the lid plate 676 by a coupler 619. An O-ring (not shown) may be positioned between the coupler 619 and the first surface 612. Processing gasses then travel through a hole 614 that passes through the lid plate 676. The gas distribution continues with a hole 635 that passes through the conductive body 673 of the housing 672. In an embodiment, an O-ring or the like (not shown) may surround the interface between the hole 614 and the hole 635 to provide a seal.

As shown, the hole 635 intersects with channel 630. The channel 630 laterally distributes the processing gas. The channel 630 is sealed by a cover 631, and gas is distributed out of the housing 672 by passing through groups 632 of holes 637 in the cover 631. In an embodiment, the gas then flows through holes 663 through the dielectric plate 660. The holes 663 may be aligned with the holes 637 in the groups 632. In an embodiment, the holes 663 through the dielectric plate 660 have a diameter that is larger than the diameter of the holes 637 through the cover 631. In an embodiment, an O-ring or the like (not shown) surrounds the interface between the holes 637 in the cover 631 and the holes 663 through the dielectric plate 660.

Figure 7:
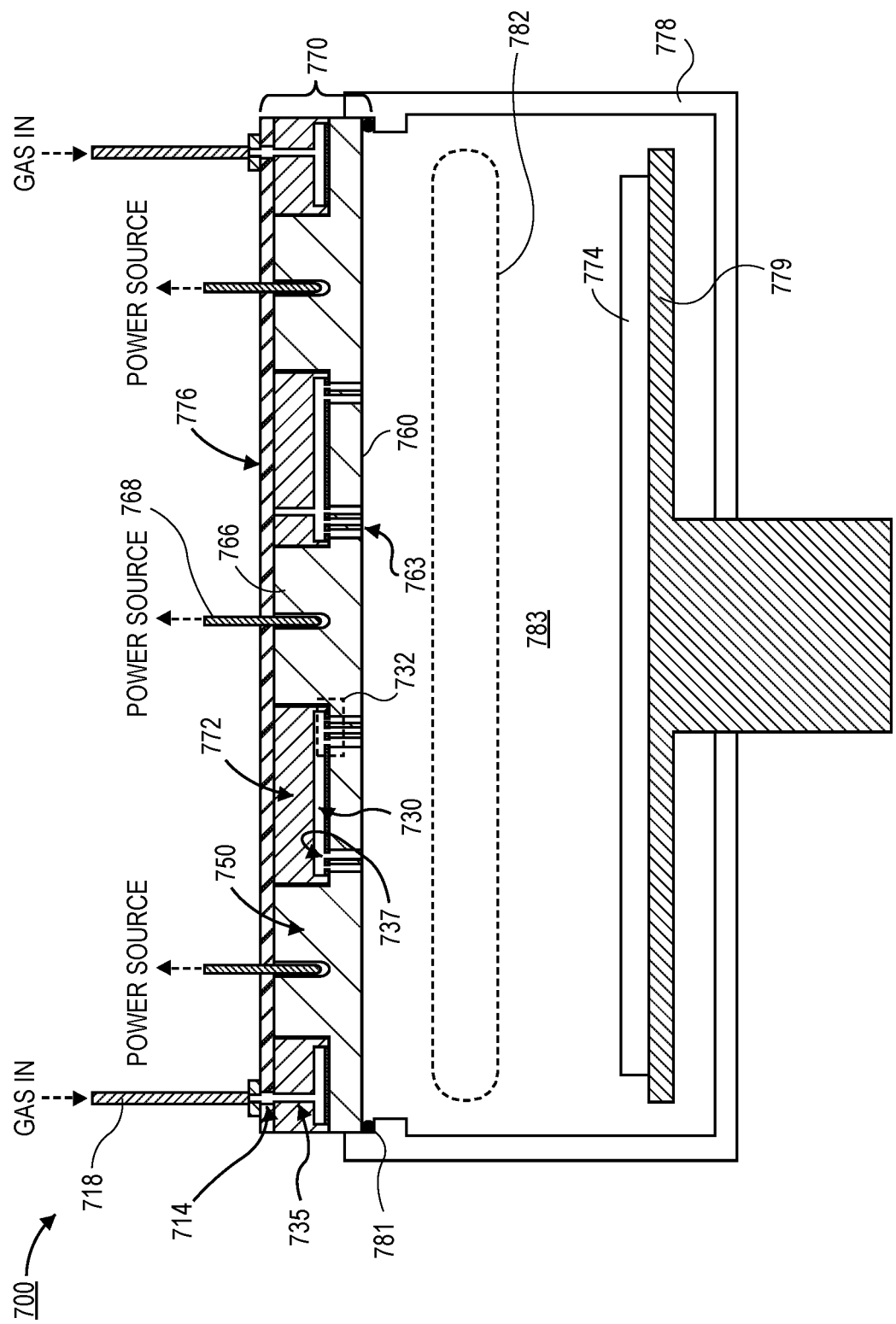
FIG. 7 is a cross-sectional illustration of a processing tool that includes an assembly with an integrated gas distribution network, in accordance with an embodiment.

Referring now to FIG. 7, a cross-sectional illustration of a processing tool 700 that includes an assembly 770 is shown, in accordance with an embodiment. In an embodiment, the processing tool comprises a chamber 778 that is sealed by an assembly 770. For example, the assembly 770 may rest against one or more O-rings 781 to provide a vacuum seal to an interior volume 783 of the chamber 778. In other embodiments, the assembly 770 may interface with the chamber 778. That is, the assembly 770 may be part of a lid that seals the chamber 778. In an embodiment, the processing tool 700 may comprise a plurality of processing volumes (which may be fluidically coupled together), with each processing volume having a different assembly 770. In an embodiment, a chuck 779 or the like may support a workpiece 774 (e.g., wafer, substrate, etc.).

In an embodiment, the assembly 770 may be substantially similar to the assemblies 670 described above. For example, the assembly 770 comprises a monolithic source array 750, a housing 772, and a lid plate 776. The monolithic source array 750 may comprise a dielectric plate 760 and a plurality of protrusions 766 extending up from the dielectric plate 760. The housing 772 may having openings sized to receive the protrusions 766. In an embodiment, monopole antennas 768 may extend into holes in the protrusions 766. The monopole antennas 768 may pass through a lid plate 776 over the housing 772 and the protrusions 766.

In an embodiment, the chamber volume 783 may be suitable for striking a plasma 782. That is, the chamber volume 783 may be a vacuum chamber. In order to strike the plasma 782, processing gasses may be flown into the chamber volume 783. The processing gasses may enter the assembly 770 via a gas line 718. The processing gas then passes through a hole 714 through the lid plate 776 and enters a hole 735 in the housing 772. The hole 735 intersects a gas distribution channel 730 that laterally distributes the processing gas. The processing gas exits the channel 730 through groups 732 of holes 737 in a cover over the channel 730. The processing gas then passes through gas distribution holes 763 through the dielectric plate 760 of the monolithic source array 750 and enters the chamber volume 783.

Figure 8:
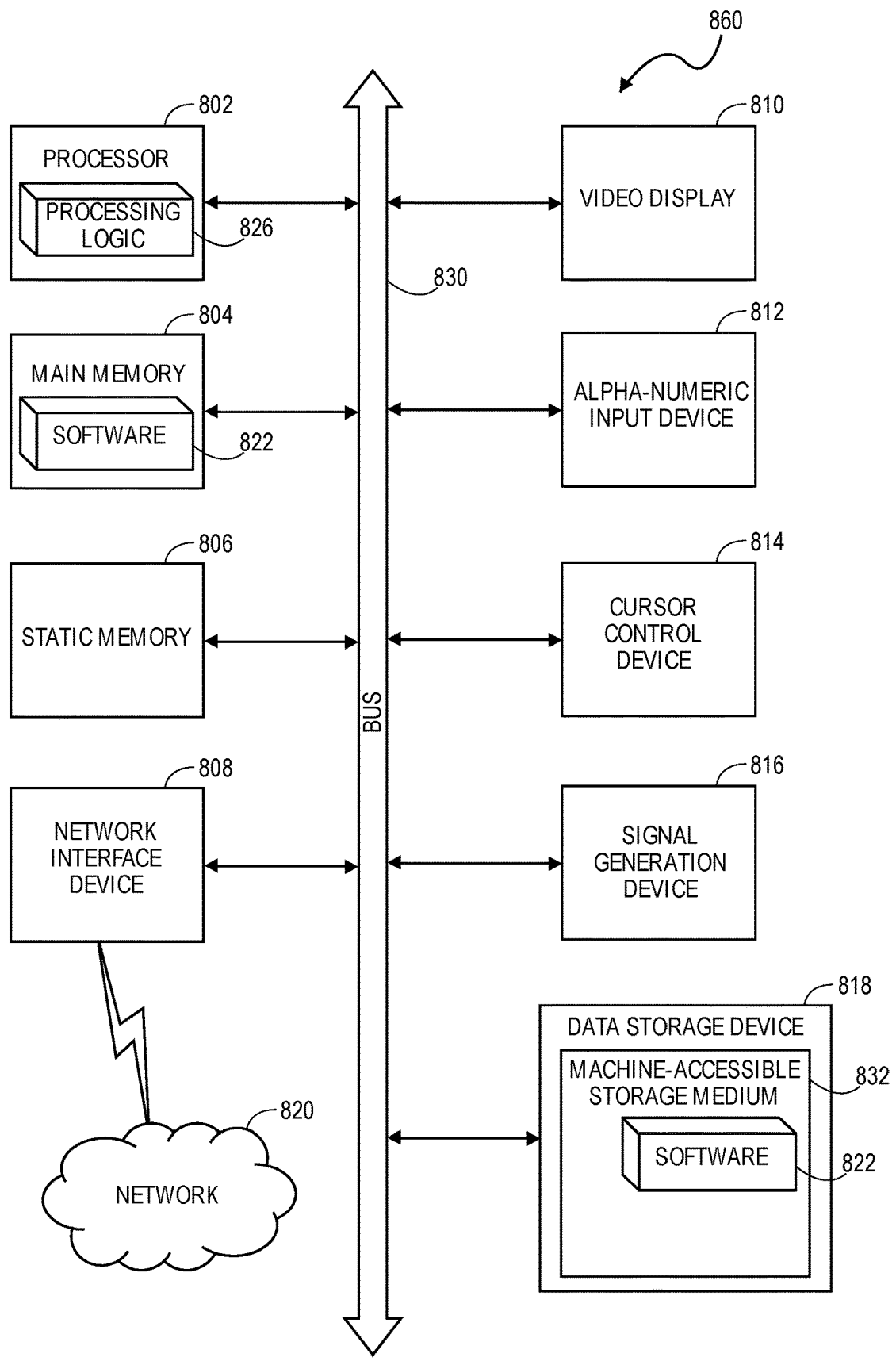
FIG. 8 illustrates a block diagram of an exemplary computer system that may be used in conjunction with a high-frequency plasma tool, in accordance with an embodiment.

Referring now to FIG. 8, a block diagram of an exemplary computer system 860 of a processing tool is illustrated in accordance with an embodiment. In an embodiment, computer system 860 is coupled to and controls processing in the processing tool. Computer system 860 may be connected (e.g., networked) to other machines in a Local Area Network (LAN), an intranet, an extranet, or the Internet. Computer system 860 may operate in the capacity of a server or a client machine in a client-server network environment, or as a peer machine in a peer-to-peer (or distributed) network environment. Computer system 860 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 860, the term "machine" shall also be taken to include any collection of machines (e.g., computers) that individually or jointly execute a set (or multiple sets) of instructions to perform any one or more of the methodologies described herein.

Computer system 860 may include a computer program product, or software 822, having a non-transitory machine-readable medium having stored thereon instructions, which may be used to program computer system 860 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 860 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 860 may further include a system network interface device 808 for communicating with other devices or machines. The computer system 860 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 832 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 860, the main memory 804 and the system processor 802 also constituting machine-readable storage media. The software 822 may further be transmitted or received over a network 820 via the system network interface device 808. In an embodiment, the network interface device 808 may operate using RF coupling, optical coupling, acoustic coupling, or inductive coupling.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A housing, comprising: a conductive body, wherein the conductive body comprises a first surface and a second surface opposite from the first surface, wherein the conductive body is electrically conductive; a plurality of openings through the conductive body, wherein the plurality of openings have vertical sidewalls with a width that is uniform through a thickness of the conductive body; a plurality of channels disposed into the second surface of the conductive body, wherein the channels consist of a plurality of circular portions and linear portions, the linear portions intersect at the circular portions, and wherein for each of the plurality of circular portions of the channels and each of the plurality of openings through the conductive body, only a single corresponding one of the plurality of circular portions continuously laterally encircles an entirety of only a single corresponding one of the plurality of openings; a cover over the channel, and wherein the cover comprises first holes that pass through a thickness of the cover; and a second hole through a thickness of the conductive body, wherein the second hole intersects with the channel, and wherein the second hole is fluidically coupled with the channel.

2. The housing of claim 1, wherein the cover is welded to the conductive body.

3. The housing of claim 1, wherein the second hole is further from an axial center of the conductive body than the first holes.

4. The housing of claim 1, wherein the first holes are arrange in a plurality of groups, wherein first groups have a first number of first holes, and wherein second groups have a second number of first holes that is greater than the first number.

5. The housing of claim 4, wherein the first groups are further from an axial center of the conductive body than the second groups.

6. The housing of claim 1, wherein a diameter of each opening is approximately 15 mm or greater.

7. The housing of claim 1, further comprising:
a plurality of channels into the second surface of the conductive body; and
a plurality of second holes, wherein each second hole intersects a different one of the plurality of channels.

8. The housing of claim 7, further comprising:
a lid plate over the first surface of the conductive body.

9. The housing of claim 8, further comprising:
a plurality of third holes through the lid plate, wherein each of the third holes is fluidically coupled to a different one of the second holes.

10. The housing of claim 9, wherein the plurality of third holes are fluidically coupled to a gas inlet by a plurality of gas lines.

11. The housing of claim 10, wherein a distance along the gas lines between the gas inlet and each of the third holes is substantially uniform.

12. An assembly, comprising: a monolithic source array, wherein the monolithic source array comprises: a dielectric plate, wherein the dielectric plate comprises a first surface and a second surface opposite from the first surface; a plurality of protrusions extending out from the first surface of the dielectric plate; and a plurality of gas distribution holes from the first surface to the second surface of the dielectric plate; and a housing attached to the monolithic source array, wherein the housing comprises: a conductive body, wherein the conductive body comprises a third surface and a fourth surface opposite from the third surface, wherein the conductive body is electrically conductive; a plurality of openings through the conductive body, wherein each of the openings surround a different one of the plurality of protrusions, wherein the plurality of openings have vertical sidewalls with a width that is uniform through a thickness of the conductive body; a plurality of channels into the fourth surface of the conductive body; wherein the channels consist of a plurality of circular portions and linear portions, the linear portions intersect at the circular portions, a cover over the channel, wherein the cover comprises a plurality of first holes, wherein each of the first holes is fluidically coupled to a gas distribution hole; and a second hole through the conductive body, wherein the second hole intersects with the channel, and wherein the second hole is fluidically coupled with the channel.

13. The assembly of claim 12, further comprising:
a lid plate over the third surface of the conductive body.

14. The assembly of claim 13, further comprising:
a third hole through the lid plate, wherein the third hole is fluidically coupled to the second hole.

15. The assembly of claim 13, wherein the lid plate is bolted to the conductive body.

16. The assembly of claim 12, wherein the channel encircles at least one of the openings.

17. A processing tool, comprising: a chamber; and an assembly interfacing with the chamber, wherein the assembly comprises: a monolithic source array, wherein the monolithic source array comprises a plurality of protrusions and a plurality of gas distribution holes through a thickness of the monolithic source array; and a housing, wherein the housing comprises: a conductive body, wherein the conductive body is electrically conductive; openings through the conductive body for receiving the plurality of protrusions, wherein the openings have vertical sidewalls with a width that is uniform through a thickness of the conductive body; and a plurality of channels in the conductive body, wherein the channels consist of a plurality of circular portions and linear portions, the linear portions intersect at the circular portions, wherein the channels are fluidically coupled to the gas distribution holes.

18. The processing tool of claim 17, further comprising:
a lid plate over the housing, wherein the lid plate comprises a hole that passes through the lid plate and is fluidically coupled to the channel.

19. The processing tool of claim 17, wherein the channel encircles at least one of the openings through the conductive body.

* * * * *